(12) United States Patent
Yoshii et al.

(10) Patent No.: US 7,771,906 B2
(45) Date of Patent: Aug. 10, 2010

(54) EXPOSURE METHOD

(75) Inventors: Hiroto Yoshii, Utsunomiya (JP); Kenichiro Mori, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 12/402,095

(22) Filed: Mar. 11, 2009

(65) Prior Publication Data

US 2009/0180097 A1    Jul. 16, 2009

Related U.S. Application Data

(62) Division of application No. 11/460,663, filed on Jul. 28, 2006, now abandoned.

(30) Foreign Application Priority Data

Jul. 29, 2005   (JP)   ............... 2005-220529

(51) Int. Cl.
  *G03F 9/00*   (2006.01)
  *G03C 5/00*   (2006.01)
(52) U.S. Cl. ........................................ 430/30; 430/311
(58) Field of Classification Search .................. 430/30, 430/311
  See application file for complete search history.

(56) References Cited

U.S. PATENT DOCUMENTS

| 5,879,844 | A | 3/1999 | Yamamoto et al. |
| 6,593,226 | B2 | 7/2003 | Travis et al. |
| 6,873,938 | B1 | 3/2005 | Paxton et al. |
| 2005/0028129 | A1 | 2/2005 | Hsu et al. |

FOREIGN PATENT DOCUMENTS

| JP | 9-319067 | 12/1997 |
| JP | 2002-319539 | 10/2002 |
| JP | 2003-257819 | 9/2003 |
| JP | 2005-26701 | 1/2005 |
| JP | 2005-94015 | 4/2005 |

OTHER PUBLICATIONS

Seevinck et al, "Static-Noise Margin Analysis of MOS SRAM Cells", IEEE Journal of Solid State Circuits, vol. SC-22, No. 5, Oct. 1987, pp. 748-754.
Honda et al, "Design Rule Optimization for 65nm-node (CM0S5) BEOL Using Process and Layout Decomposition Methodology", Design and Process Integration for Microelectronic Manufacturing II, edited by Lars W. Liebmann, Proc. of SPIE vol. 5379, 2004, pp. 111-118.

*Primary Examiner*—Christopher G Young
(74) *Attorney, Agent, or Firm*—Rossi, Kimms & McDowell LLP

(57) ABSTRACT

An exposure method for exposing a pattern of a reticle onto a plate using a light from a light source and an optical system includes the steps of obtaining a relationship between an exposure parameter that determines a mode to expose a plate, and an electrical characteristic of a device derived from the device, determining whether the device obtained from the set exposure parameter has a predetermined electrical characteristic, and adjusting the set exposure parameter based on the relationship between the exposure parameter and the electrical characteristic, if the determining step determines that the device does not have the predetermined electrical characteristic.

7 Claims, 14 Drawing Sheets

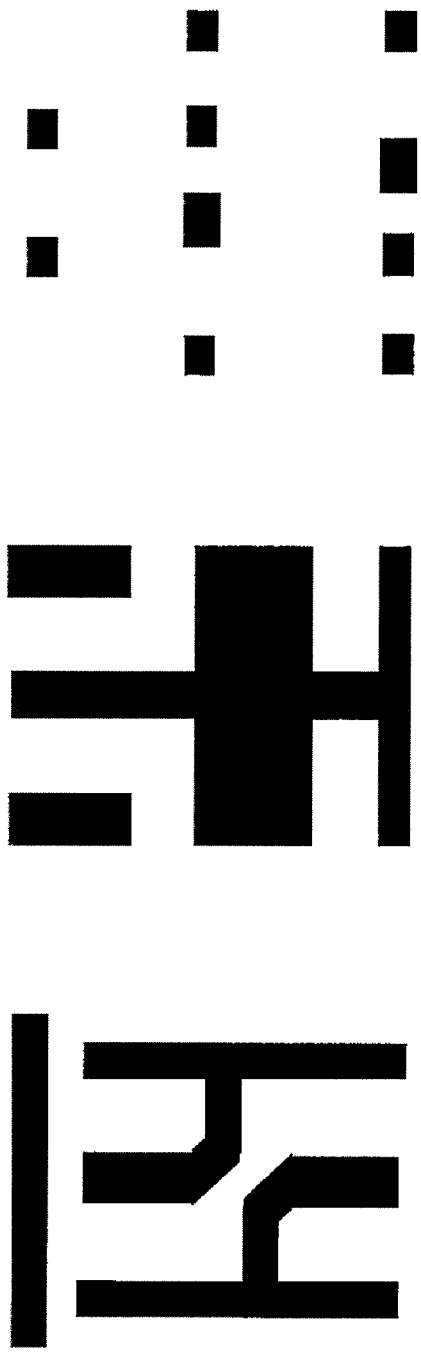
FIG. 11A GATE LAYER
FIG. 11B DEVICE SEPARATING LAYER
FIG. 11C CONTACT LAYER
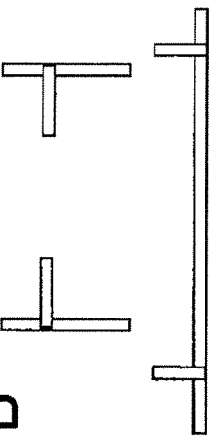
FIG. 11D SOURCE/DRAIN LAYER
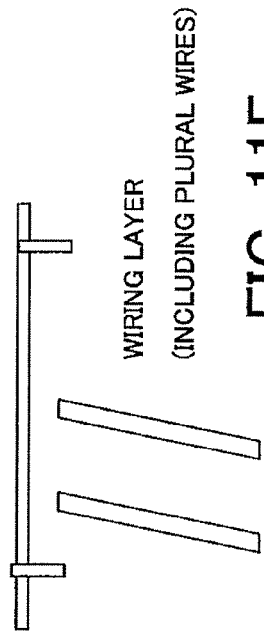
FIG. 11E WIRING LAYER (INCLUDING PLURAL WIRES)

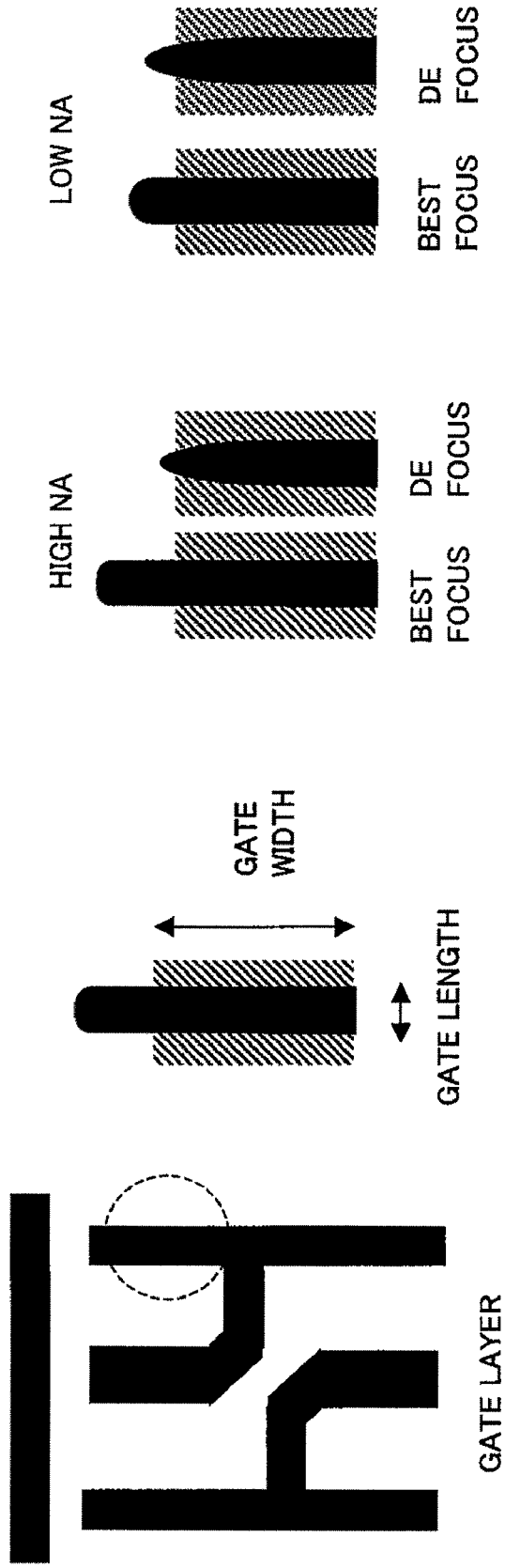

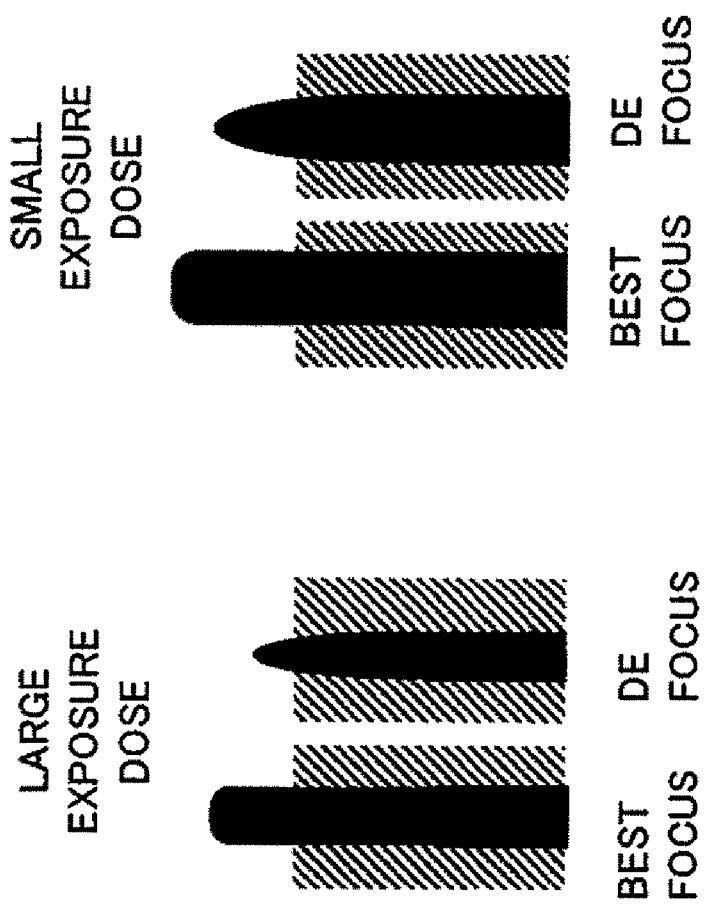
FIG. 13B
FIG. 13C
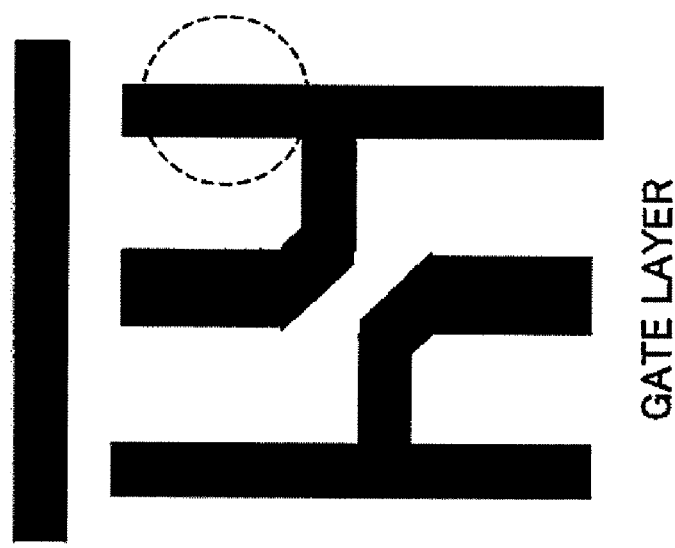
FIG. 13A

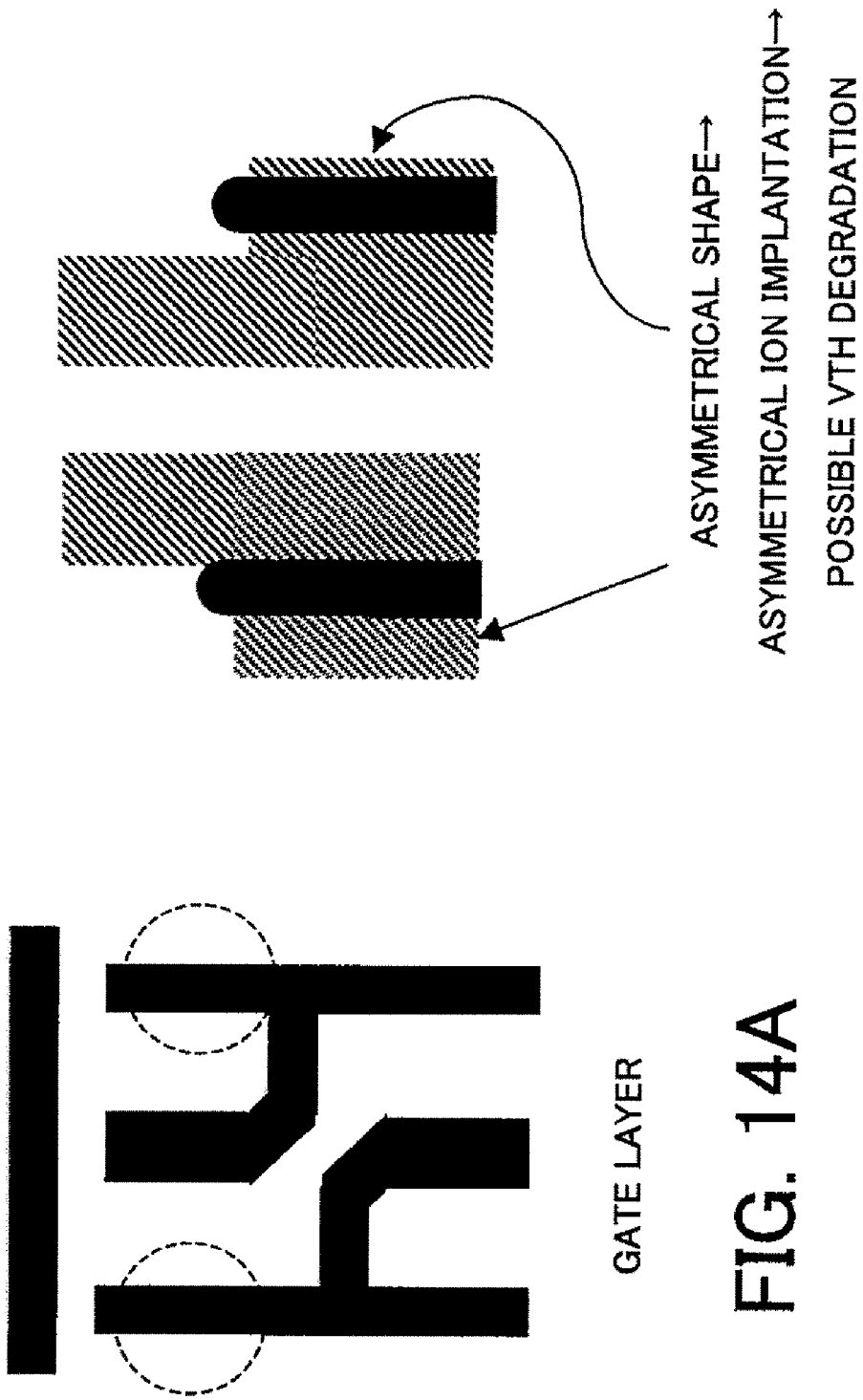

EXPOSURE METHOD

This is a divisional application of prior application Ser. No. 11/460,663, filed Jul. 28, 2006, now abandoned to which priority under 35 U.S.C. §120 is claimed. This application also claims priority under 35 U.S.C. §119 to Japanese Patent Application No. 2005-220529 filed on Jul. 29, 2005, the entire contents of which are incorporated herein by reference.

BACKGROUND OF THE INVENTION

The present invention relates generally to an exposure method, and more particularly to an optimization of an exposure condition.

A conventional projection exposure apparatus uses a projection optical system to expose a reticle (or mask) pattern onto a plate, such as a single crystal substrate for a semiconductor wafer, and a glass plate for a liquid crystal display. In order to meet a demand for inexpensively supplying many electronic apparatuses, a method for manufacturing a device, such as a semiconductor chip (e.g., an LSI, a VLSI), a CCD, an LCD, a magnetic sensor, and a thin-film magnetic head), needs to improve the yield rate. This device manufacturing method includes various processes, such as exposure, development, and etching. In exposure, a conventional exposure apparatus considers not only the resolution at which the reticle pattern precisely resolve on a plate to be exposed, but also the influence on the other processes in the device manufacturing method.

The optimizations of both the exposure condition and the reticle pattern are important for improved resolution. See, for example, Japanese Patent Applications, Publication Nos. 2005-26701 and 2002-319539. A reticle pattern is optimized, for example, through an optical proximity correction ("OPC"). A critical dimension ("CD") uniformity is known as a general conventional evaluation index of the resolution. See, for example, Japanese Patent Applications, Publication Nos. 2003-257819 and 2005-094015. Japanese Patent Application, Publication No. 9-319067 proposes a technology, called a process proximity control ("PPC"), which adds an etching error caused by the pattern density, to a reticle design in advance so as to correct the etching error. A simulation or a simulator may be used instead of actually exposing the plate for effective optimizations.

Other prior art include, for example, SPIE 5379-15 Design rule optimization for 65-nm-node (CMOS5) BEOL using process and layout decomposition methodology and Evert Seevinck, Frans J. List, and Jan Lohstroh, "Static-Noise Margin Analysis of MOS SRAM Cells," IEEE Journal of Solid-State Circuits, Vol. SC-22, NO. 5, October (1987). The above SPIE reference discloses a via chain as a test pattern under various design rules, measures the resistance, and determines whether the design rules and the OPC are properly set.

As finer processing advances, an interaction between processes in the device manufacturing method becomes non-negligible, and the yield rate control over exposure only using the CD uniformity cannot necessarily improve the yield rate. Whether or not the device is defective as an electronic component depends upon the electrical characteristic of the device. A typical example of the electrical characteristic is a power supply voltage characteristic that is defined as a voltage change of the device to the power supply, but the electrical characteristic may be durability, resistance, electric capacity, etc.

For a static RAM ("SRAM"), an illustrative electrical characteristic includes a static noise margin ("SNM") (see the above IEEE reference), $V_{TH}$ difference in a transistor gate, etc. The electrical characteristic to be verified differs according to device types.

However, the evaluation index relating to the resolution does not always correspond to the electrical characteristic. For example, even when the CD uniformity is bad, the device is not defective in view of the electrical characteristic, and even when satisfying a predetermined CD uniformity, the device is defective in view of the electrical characteristic.

BRIEF SUMMARY OF THE INVENTION

The present invention is directed to an exposure method that can manufacture a device as a final product with a good yield rate.

An exposure method according to one aspect of the present invention for exposing a pattern of a reticle onto a plate using a light from a light source and an optical system includes the steps of obtaining a relationship between an exposure parameter that determines a mode to expose a plate, and an electrical characteristic of a device derived from the device, determining whether the device obtained from the set exposure parameter has a predetermined electrical characteristic, and adjusting the set exposure parameter based on the relationship between the exposure parameter and the electrical characteristic, if said determining step determines that the device does not have the predetermined electrical characteristic. A database that stores a relationship used for the above exposure method, and a program for enabling a computer to implement the exposure method also constitute one aspect of the present invention.

Other objects and further features of the present invention will become readily apparent from the following description of the preferred embodiments with reference to the accompanying drawings.

BRIEF DESCRIPTION OF THE DRAWINGS

FIG. 11A to 11E are layer structures in the SRAM shown in FIG. 10.

FIGS. 12A to 12D show a relationship between the gate line end shorting ("LES") and NA.

FIGS. 13A-13C show a relationship between the gate LES and exposure dose.

FIGS. 14A and 14B show an overlay between a gate layer and a source/drain layer.

DETAILED DESCRIPTION OF THE PREFERRED EMBODIMENTS

Figure 1:
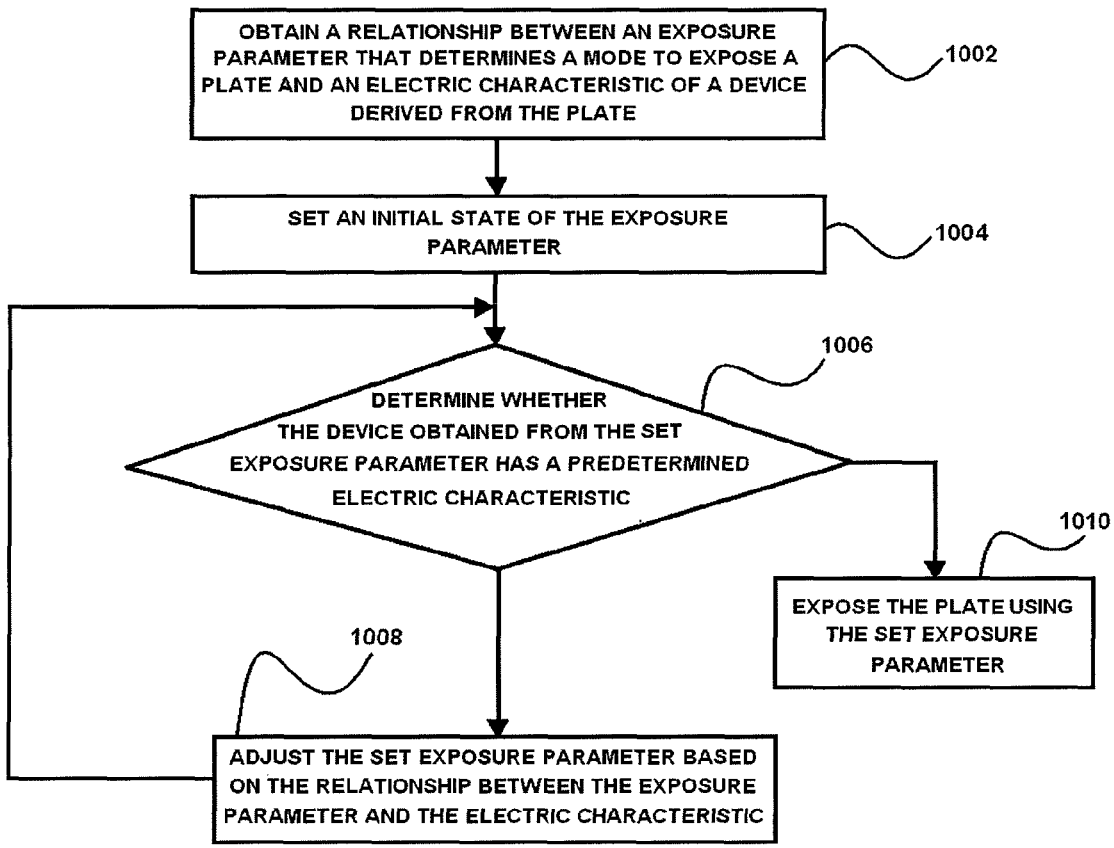
FIG. 1 is a flowchart of an optimization algorithm according to the present invention.
Figure 4:
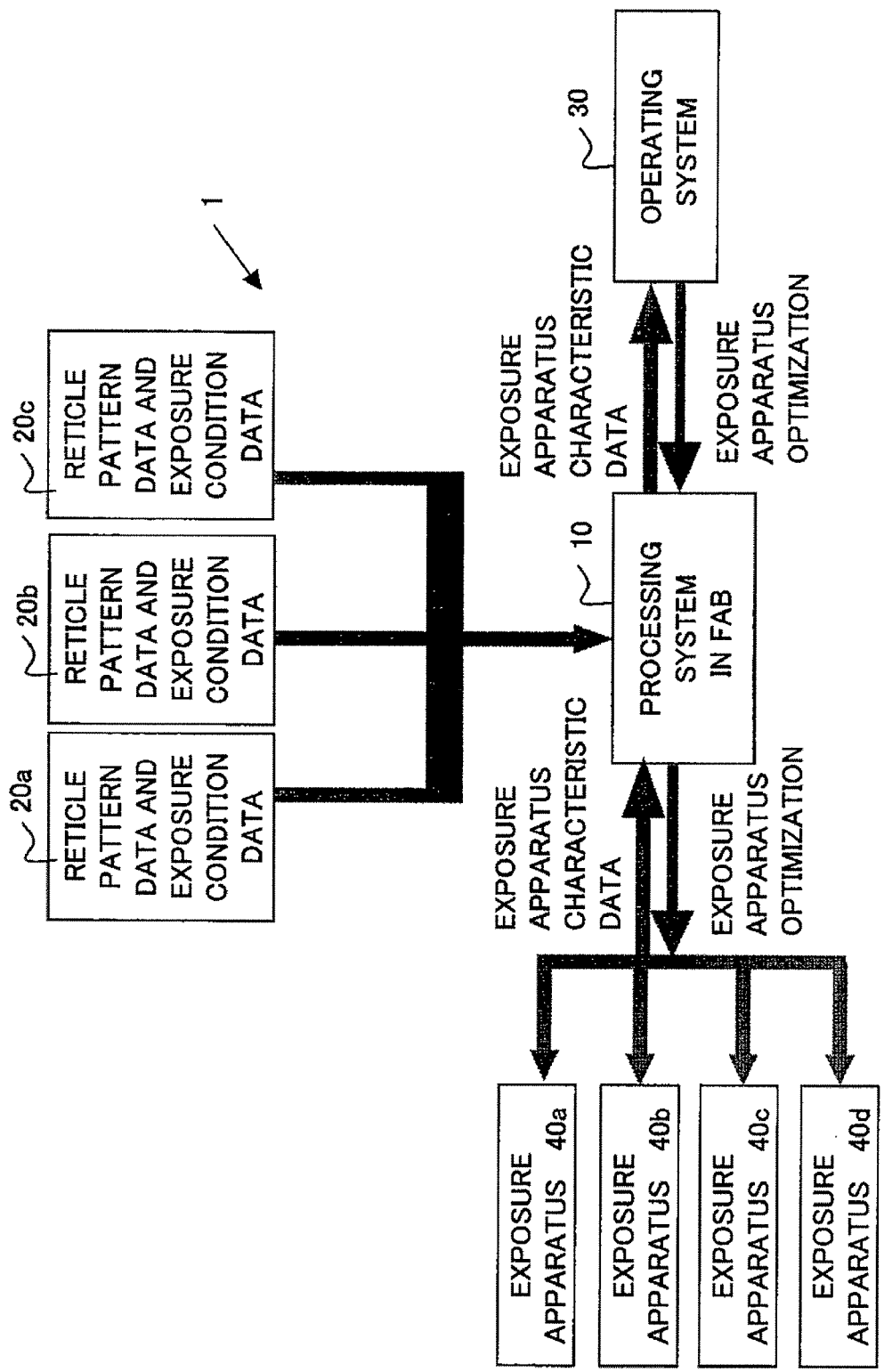
FIG. 4 is a schematic block diagram of an exposure system that executes the optimization method shown in FIG. 1.

Referring now to the accompanying drawings, a description will be given of the preferred embodiments of the present invention. FIG. 1 is a flowchart of an optimization algorithm of this embodiment. FIG. 4 shows an exposure system 1 that executes the optimization algorithm shown in FIG. 1. The exposure system 1 includes, as shown in FIG. 4, a processing system 10 in a FAB (factory), input parts 20a-20c, an operating system 30, and exposure apparatuses 40a-40d.

The processing system 10 obtains reticle data and exposure condition from the input parts 20a to 20c, and selects an appropriate one of the exposure apparatuses 40a to 40d. The exposure apparatuses 40a to 40d have different characteristic data and specifications, such as a light source (ArF, KrF, EUV etc.), an exposure method (scanner, stepper, etc.), an illumination condition (polarization illumination, effective light source, etc.), and a projection optical system (dioptric, catadioptric, immersion system, etc.). In addition to these data, the processing system 10 has difference data among the same type of exposure apparatuses. The processing system 10 previously obtains the characteristic data of the exposure apparatuses 40a to 40d, and stores them in a memory. The operating system 30 is a computer that executes the optimization algorithm shown in FIG. 1. The operating system 30 obtains the characteristic data of the exposure apparatus selected from the processing system, and optimizes the exposure parameter based on the electrical characteristic of the device, if necessary. The processing system 10 obtains the optimization information of the exposure parameter from the operating system 30, and sets it in the exposure apparatus. The processing system in the FAB and the operating system may be a single computer system inside or outside the FAB, or only the operating system may be located outside the FAB.

Referring to FIG. 1, the optimization algorithm of this embodiment first obtains a relationship between an exposure parameter that determines a mode to expose a plate and an electrical characteristic of a device derived from the plate (step 1002). This embodiment utilizes, for the electrical characteristic, a power supply voltage characteristic that is a voltage change of the device to the power supply.

The exposure parameter includes, for example, a numerical aperture ("NA") of a projection optical system, an exposure dose, a focus, a Zernike coefficient, a pupil transmittance, an effective light source distribution, a telecentricity, a polarization degree, a polarization degree difference among image heights, a slit profile, a spectrum distribution of the light source, a longitudinal magnification, a lateral magnification, a shot rotation, and a decentering distortion.

The electrical characteristic can be evaluated by utilizing a Monte Carlo simulation and sensitivity analysis ("MCSS") as described later, without actually completing the device. The device's electrical characteristic is likely to dramatically affect the yield rate as a memory cell size reduces in the future fine processing. The following primary causes are influential to the electrical characteristic: Firstly, a difference amount due to the manufacturing factor can increase relative to the design size of the gate width and the gate length. Secondly, an ion implantation dose difference cannot be negligible as the gate size reduces. Thirdly, a difference of the gate film thickness and the gate film dielectric constant cannot be negligible.

On the other hand, it is known that a certain electrical characteristic relates to a specific evaluation index. For example, according to the above SPIE reference, the line end shorting ("LES"), etc. deteriorate the yield rate. The LES is a phenomenon of a non-resolution of a tip of a line pattern due to the focusing fluctuation. The LES occurs with an insufficient OPC due to the device layout limitation. A relationship between the LES and the electrical characteristic is, for example, such that the LES in the gate layer changes the electrical characteristic, such as resistance, due to the gate length. Other factors for this type of phenomenon are a line edge roughness (LER) and a sidewall angle ("SWA") relating to the SNM, and commonly influential on the electrical characteristic because they are likely to change the circuit shape.

Figure 2:
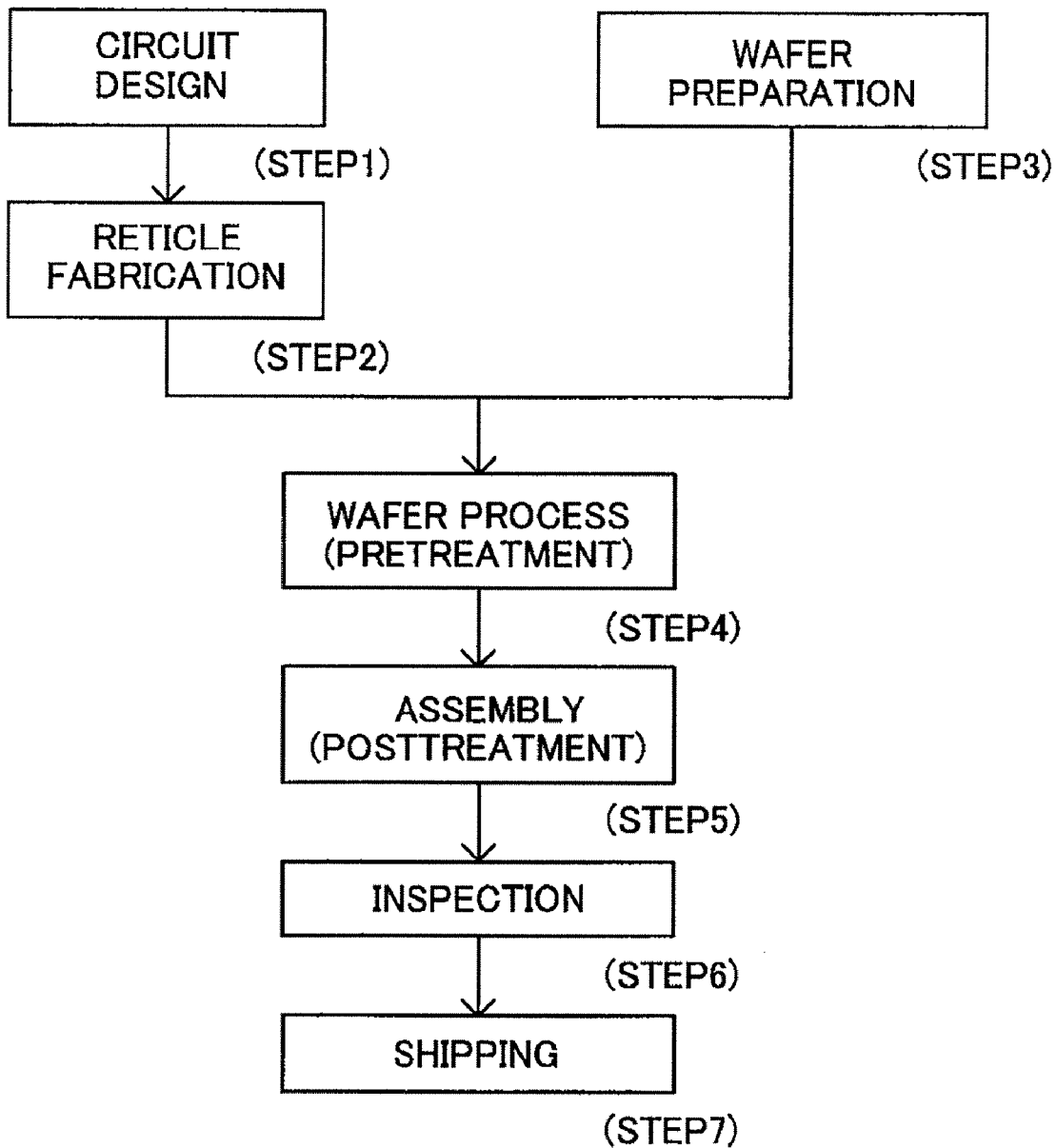
FIG. 2 is a flowchart for explaining a device manufacturing method according to the present invention.
Figure 3:
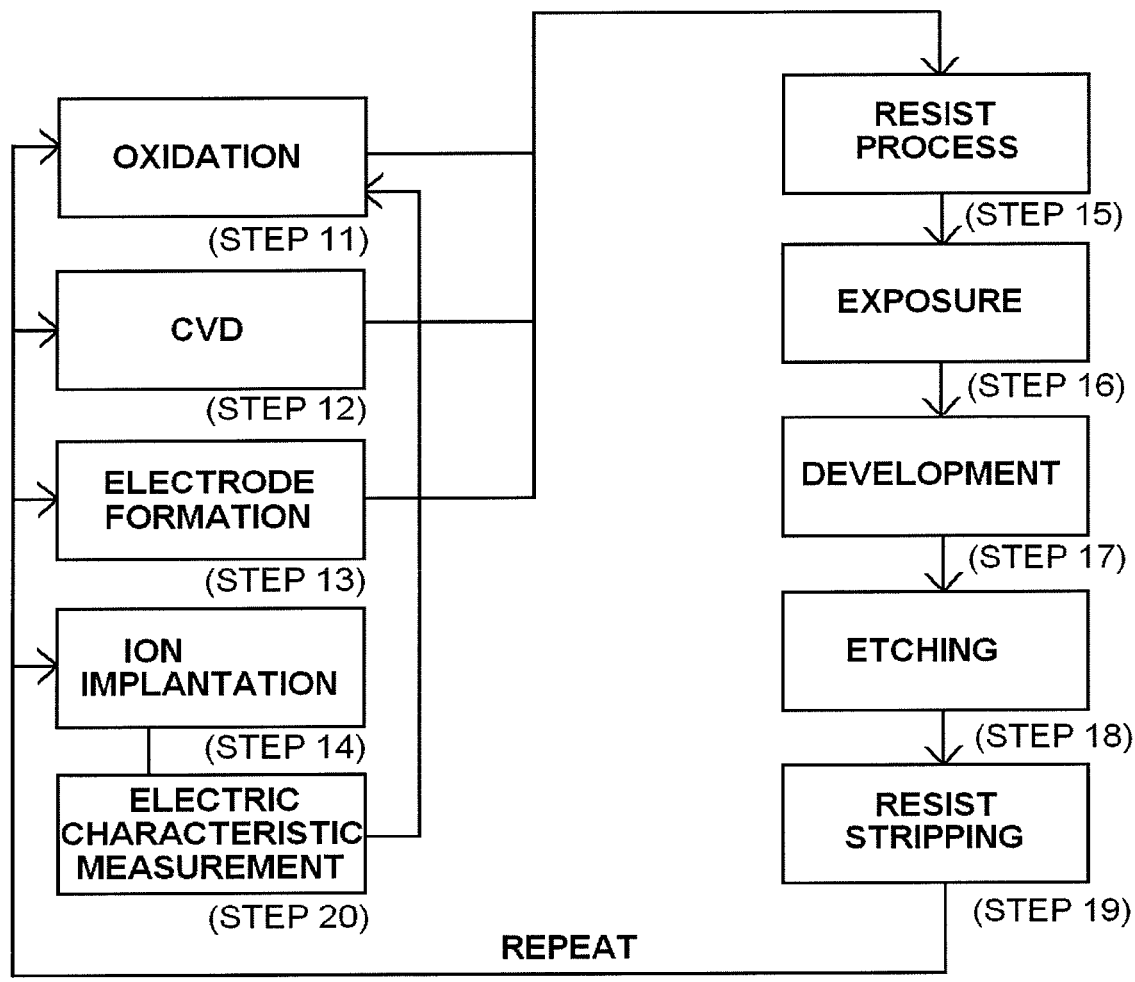
FIG. 3 is a flowchart of a step 4 shown in FIG. 2.

Step 1002 obtains the above relationship, for example, by measuring the electrical characteristic after producing the actual device with various different exposure parameters. Referring to FIGS. 2 and 3, a description will be given of an embodiment of a device manufacturing method. FIG. 2 is a flowchart for explaining how to manufacture semiconductor devices, such as semiconductor chips (ICs and LSIs), liquid crystal panels, and CCDs. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 3 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus to expose a circuit pattern of the reticle onto the wafer. Step 17 (development) develops the exposed wafer. Step 18 (etching) etches parts other than a developed resist image. Step 19 (resist stripping) removes unused resist after etching. Step 20 (electrical characteristic measurement) measures the device's electrical characteristic. These steps are repeated to form multi-layer circuit patterns on the wafer.

Next, an initial state of the exposure parameter is set (step 1004). The initial state of the exposure parameter may be set such that a large exposure margin is secured.

Then, it is determined whether the device obtained from the exposure parameter has a predetermined electrical characteristic (step 1006). For this determination, a test chip may be actually manufactured and its electrical characteristic may be measured. The simulation may use, for example, the MCSS for each layer of the device.

A description will now be given of the SNM in the SRAM. The SRAM is used for a cash memory that connects the CPU to the DRAM, accelerating the processing speed, and enhancing the high speed and efficiency of the entire system. The DRAM needs refreshing at regular time periods, whereas the SRAM uses an electronic circuit called "flip-flop." As long as the power is supplied, the data can be statically stored without refreshing.

Figure 6:
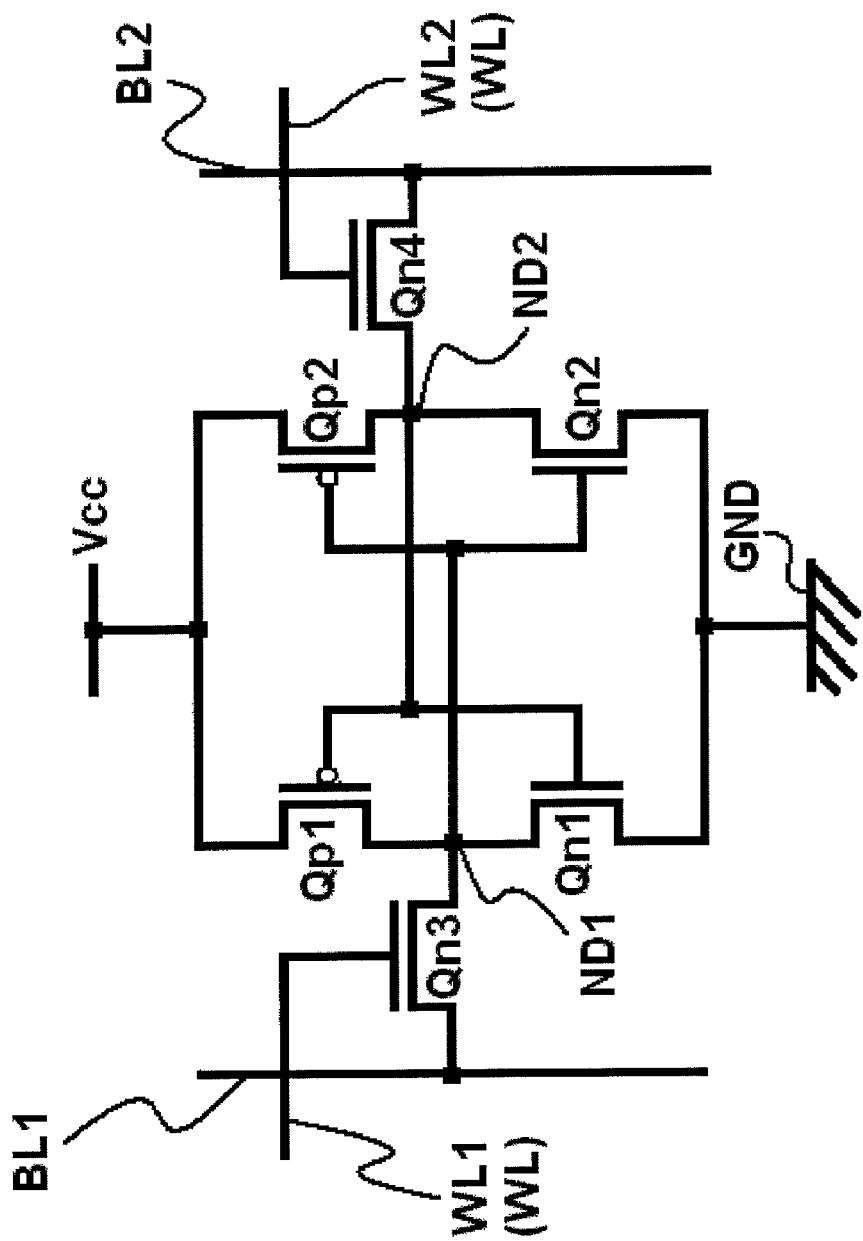
FIG. 6 is a circuit diagram of an SRAM as one illustrative device manufactured in FIGS. 2 and 3.

FIG. 6 shows a general circuit diagram of the SRAM. In writing data in the SRAM, a word line WL is turned to H (high: voltage is applied), and NMOS transistors Qn3 and Qn4 turn on. Then when the state of a bit line BL1 is turned to H and the state of a bit line BL2 is turned to L (L: no voltage applied), a switch turns on in the NMOS transistor Qn2 and a PMOS transistor Op1. Thus, "1" is written down in a left node and "0" is written down in a right node. When the BL1 is in the L state and BL2 is in the H state, "0" is written down in a left node and "1" is written down in a right node.

In storing data in the SRAM, the state of the word line WL is turned to L, and thereby Qn3 and Qn4 are turned off. The write information is maintained as long as Vcc (or the power) is maintained, because the SRAM cell serves as a capacitor and charges accumulate.

In reading data from the SRAM, the state of the word line WL is again turned to H, and thereby Qn3 and Qn4 are turned on. When the left node is in the state of "1" and the right note is in the state of "0," the voltage is applied to BL1. A detection of the voltage enables the data to be read out. A sensing amplifier detects this voltage. The sensing amplifier is a circuit that amplifies the voltage from the memory cell. Although FIG. 6 does not specifically show the sensing amplifier, it is located on the bit line BL. The SRAM memory cell can be regarded as a very small capacitor, and the voltage read out to the bit line is as small as several hundred mV. Thus, the sense amplifier amplifies this voltage up to the processible decibel level.

Data is thus written in, held in, and read from the SRAM. However, a noise occurs in reading the data from the SRAM when the state of the word line WL turns to H, and Qn3 and Qn4 are switched on. The noise causes "1" of the left node and "0" in the right node to be erroneously detected as "0" of the left node and "1" in the right node.

Figure 7:
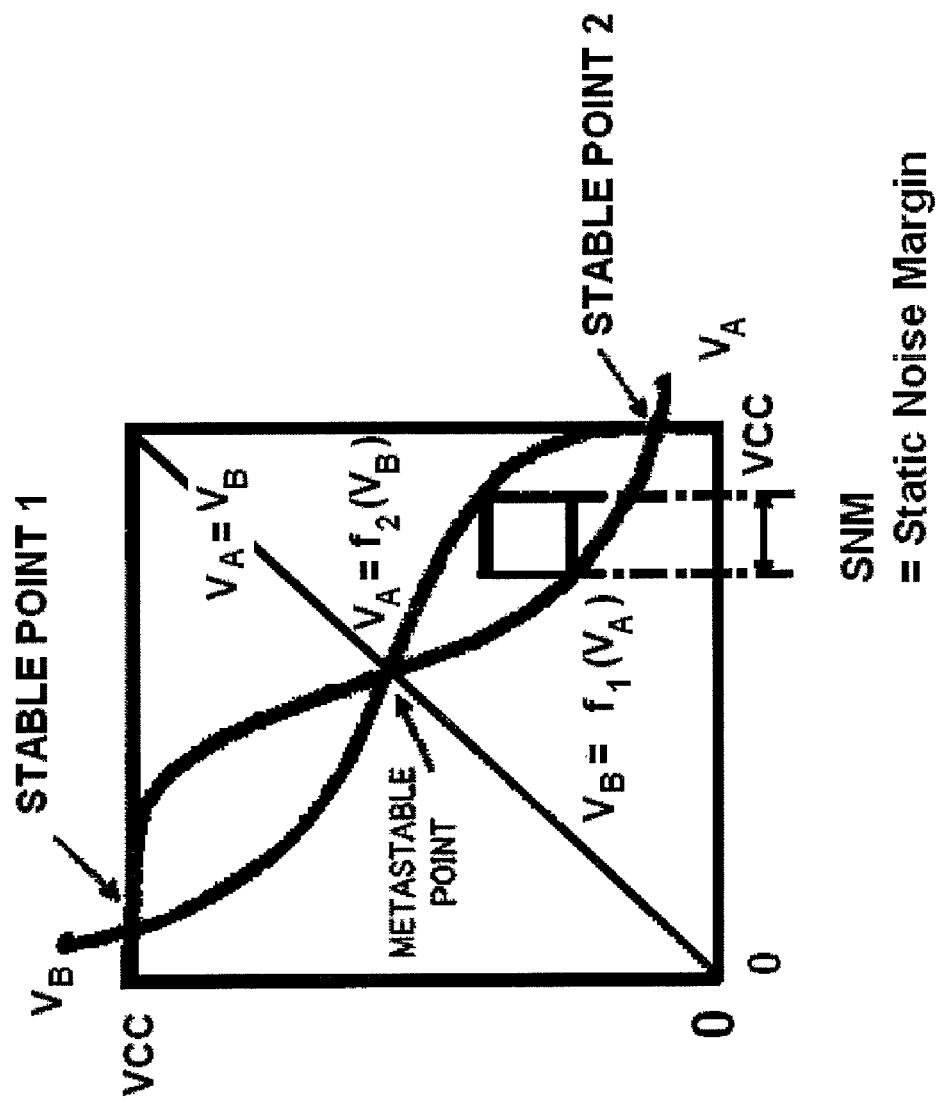
FIG. 7 is a graph for explaining a characteristic of static noise margin ("SNM") in the SRAM shown in FIG. 6.

The SNM is an index of robustness to the reading noise. FIG. 7 is a graph of the SNM of the SRAM. A curve in FIG. 7 is called a spectacle characteristic or butterfly curve. The butterfly curve can be obtained from a numerical formula by utilizing the fact that the inflow current amounts to the outflow current in ND1 (Kirchhoff's law) by taking physical effects of respective transistors Qn1, Qn2, Qn3, Qn4, Op1, and Op2.

Assume that the voltage of ND1 is $V_A$ and the voltage of ND2 is $V_B$ in FIG. 6. A stable point 1 represents the state of the left node of "0" and the right node of "1," whereas a stable point 2 represents the state of the left node of "1" and the right node of "0."

While the data is being held, a node's voltage characteristic is at one of the stable points. When the state of the stable point is turned from L to H in the word line WL, the voltage $V_A$ of the node 1 and the voltage $V_B$ of the node 2 are instantly transferring to the state of the stable 2, and return to the state of the stable point 1. With a large SNM, the state is likely to return to the stable point 1, whereas with a small SNM, the state is less likely to return to the stable point 1. With a small SNM, the sensing amplifier is likely to erroneously detect a change of the stage from the stable point 1 to the stable point 2 due to unexpected charged particle's influence. Therefore, the SRAM having a large SNM is preferable.

Figure 8:
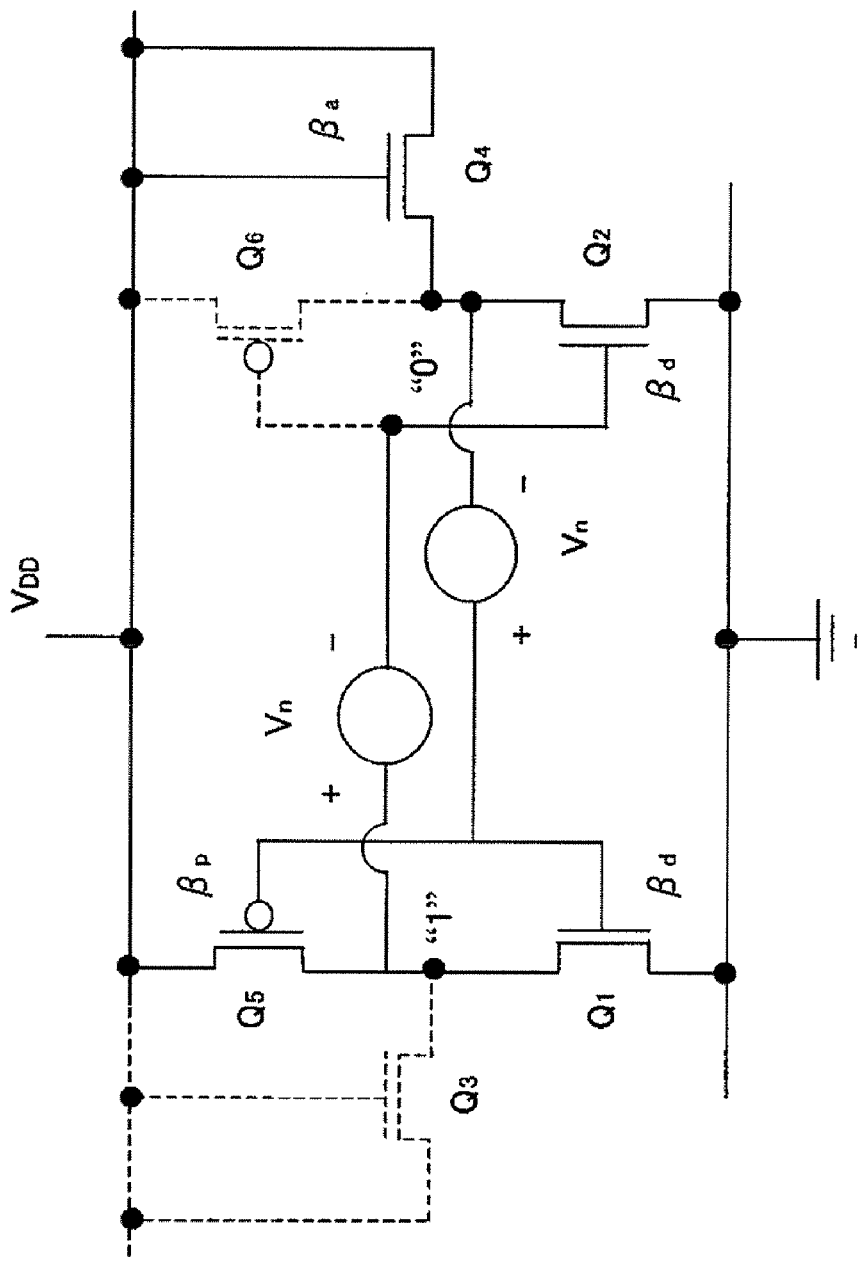
FIG. 8 is a circuit diagram of the SRAM shown in FIG. 6 that assumes a switching noise equivalent circuit.

The above IEEE reference discloses the SNM model equation in detail. According to the above IEEE reference, the SNM in the SRAM that has a noise equivalent circuit as shown in FIG. 8 is expressed as Equation 1 below from the Kirchhoff formula and the transistor's characteristic:

$$SNM_{6T} = V_T - \left(\frac{1}{k+1}\right)$$ [EQUATION 1]

-continued $$\left\{ \frac{V_{DD} - \frac{2r+1}{r+1}V_T}{1 + \frac{r}{k(r+1)}} - \frac{V_{DD} - 2V_T}{1 + k\frac{r}{q} + \sqrt{\frac{r}{q}\left(1 + 2k + \frac{r}{q}k^2\right)}} \right\}$$

"r" in Equation 1 represents a cell ratio expressed by $\beta_d$ that is (gate width)/(gate length) in a driver transistor, divided by $\beta_a$ that is (gate width)/(gate length) in an access transistor. The driver transistor corresponds to Qn1 and Qn2 in FIG. 6. The access transistor corresponds to Qn3 and Qn4 in FIG. 6.

Figure 9:
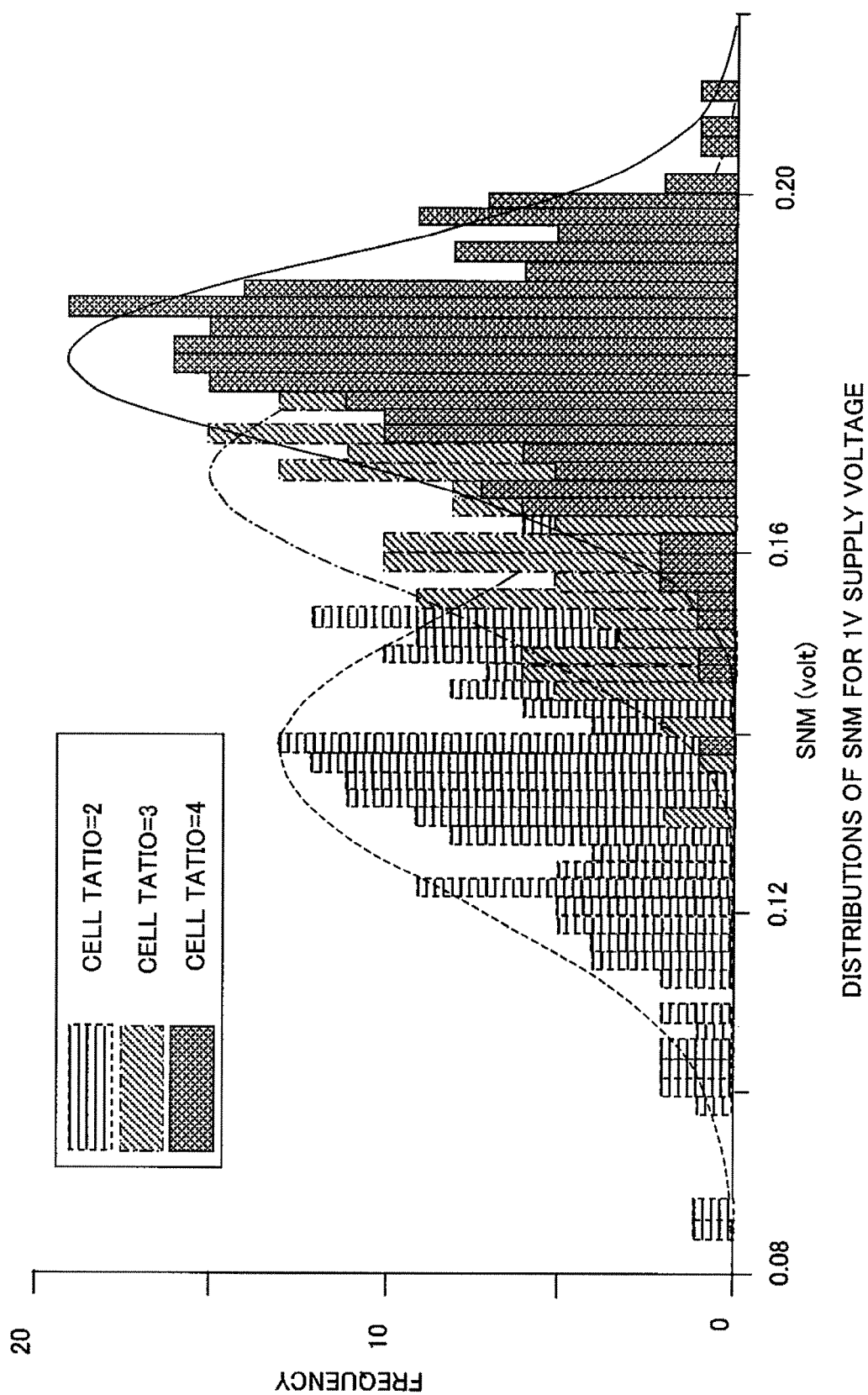
FIG. 9 is a graph for explaining a size of SNM when a cell ratio is changed.

FIG. 9 is a MCSS result of the SNM, where r=2, 3 and 4. Even with a fixed r, the SNM value varies depending upon a power supply voltage $V_{DD}$ and values of k and q as inverter characteristics, and needs simulations with different power supply voltage and inverter characteristics. FIG. 9 shows that a cell ratio of four provides a larger SNM, and thus is preferable in view of the device.

Another example of the electrical characteristic is difference of $V_{TH}$. $V_{TH}$ is a gate threshold voltage, and when the voltage applied to the gate exceeds a threshold voltage, the source and drain are electrically connected to each other. The different $V_{TH}$ values in the cell influence the yield rate of the device. Control over $V_{TH}$ would improve the yield rate of the device, but $V_{TH}$ varies due to various manufacturing process factors. By way of example of the SRAM cell circuit shown in FIG. 6, the yield rate degrades when the gate threshold voltage $V_{TH}$ scatter between the transistors Qn1 and Qn2, between the transistors Op1 and Op2, and/or between the transistors Qn3 and Qn4, when each pair of transistors are designed to have the same characteristic. It is known that this $V_{TH}$ difference is significantly influenced by not only a non-exposure-apparatus factor, such as a gate film thickness, an ion implantation dose, and a gate electrode material, but also an exposure-apparatus-factor, such as a different gate width and gate length, and the overlay between upper and lower layers.

Figure 10:
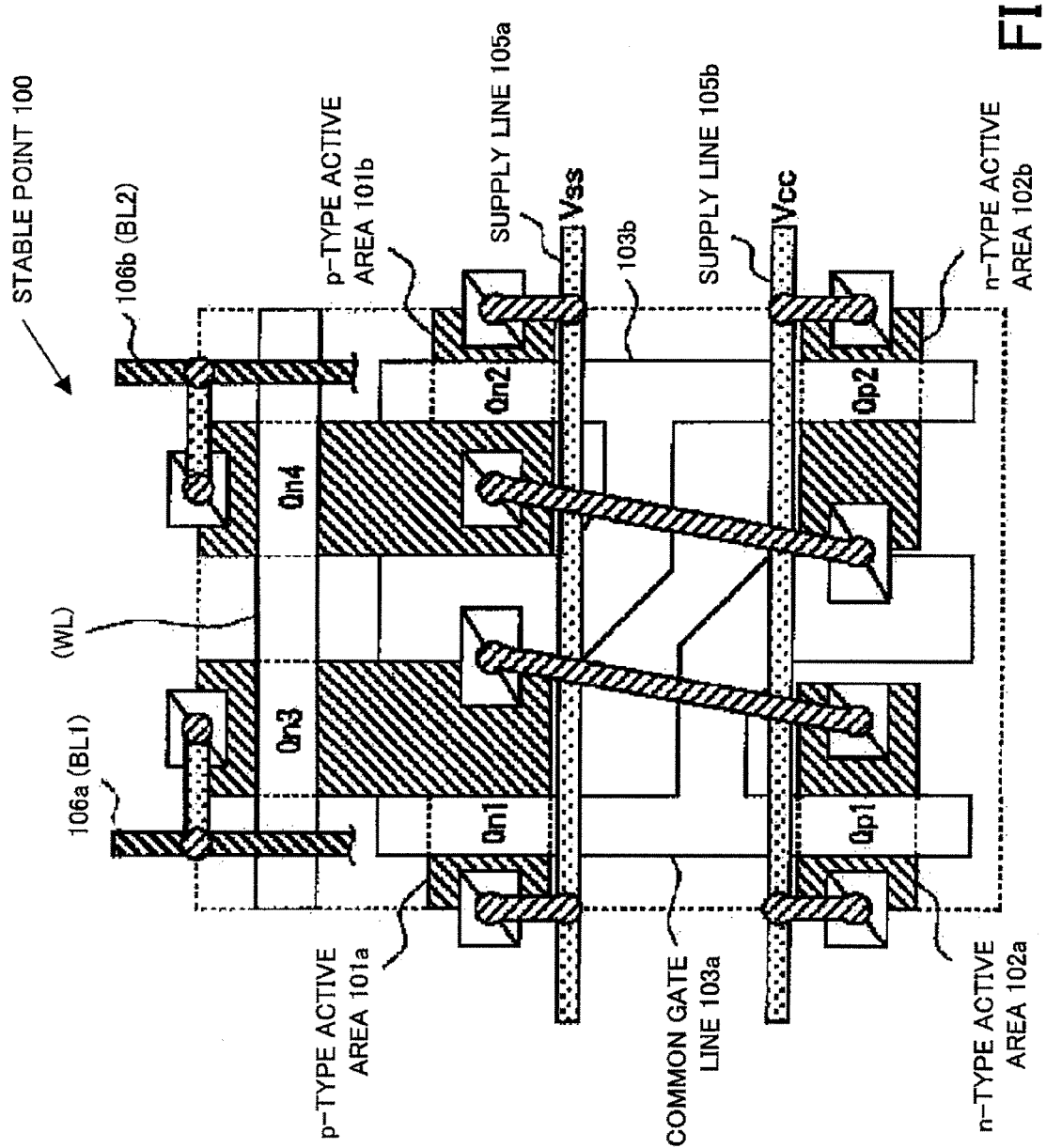
FIG. 10 shows a cell structure of the SRAM shown in FIG. 6.

FIG. 10 shows a structure of the cell 100 in the SRAM. The SRAM cell 100 shown in FIG. 10 includes a device separating layer shown by a broken line, a source/drain layer (including p-type active areas 101a-b, n-type active areas 102a-b), a gate layer (including common gate lines 103a-b), a contact layer, wiring layers (including supply lines 105a-b and bit lines 106a-b). FIG. 11A shows the gate layer. FIG. 11B shows the device separating layer. FIG. 11C shows the contact layer. FIG. 11D shows the source/drain layer. FIG. 11E shows a wiring layer. In general, after the device separating layer is formed, the source/drain layer and the gate layers are formed, and the wiring layer and the contact layer are formed according to the device structure.

Turning back to FIG. 1, when step 1006 determines that the device does not have the predetermined electrical characteristic, the exposure parameter set in step 1004 based on the relationship obtained in step 1002 is adjusted (step 1008).

This embodiment adjusts the exposure parameter (or condition) instead of the reticle pattern as in step 1008. As discussed above, since each device has its own electrical characteristic to be verified, it is preferable to optimize exposure of the plate such that the electrical characteristic to be verified improves in each device. It is conceivable as in the above SPIE reference that the reticle pattern is optimized based on the device's electrical characteristic. However, this SPIE reference merely optimizes the reticle pattern through the OPC and PPC, and does not weigh the exposure apparatus's characteristics or the reticle's manufacturing errors. Thus, the method proposed in this reference is insufficient in improving the yield rate of the device. In addition, even though the reticle pattern is optimized for a specific exposure apparatus difference, it is difficult to apply the reticle pattern to another exposure apparatus different from the specific exposure apparatuses and the flexible application to any exposure application is lost. Therefore, in optimizing the exposure condition, it is necessary that the former seek the yield rate improvement and the latter improve the flexible application.

For example, in adjusting the exposure parameter of the gate layer so as to minimize a difference of $V_{TH}$ in the SRAM cell, one of the electrical characteristics to be controlled for the device is the gate threshold voltage $V_{TH}$. In particular, in the same type of transistor in the same cell, different $V_{TH}$ causes failure of the cell. The exposure process controls $V_{TH}$ by taking into account a size effect, such as a gate length, a gate width, a gate area, and a junction area between the source/drain layer, and needs such an exposure condition as reduces differences among them. An illustrative exposure condition that reduces a different size effect is to restrain the LES caused by the defocus by adjusting the NA of the projection optical system, and the effective light source shape in the modified illumination. FIGS. 12A to 12D show the NA, the focus, and the line end quality. FIG. 12B shows part in the gate layer enclosed by a broken line in FIG. 12A.

In general, a high NA is used for a critical layer to improve the pattern transferring characteristic. Here, FIG. 12C shows the LES with a high NA in both the best focus state and the defocus state. FIG. 12D shows the LES with a low NA in both the best focus state and the defocus state. Referring to FIGS. 12C and 12D, the CD in the best focus state becomes clear with a high NA, and unclear with a low NA. The LES in the defocus state becomes large with a high NA, and small with a low NA. For direct yield rate improvement, the future fine processing will emphasize the yield rate viewed from the electrical characteristic stronger than the yield rate viewed from the pattern transfer characteristic. In this case, the NA should be made small.

Another embodiment optimizes the exposure condition of the gate layer such that the SNM becomes maximum in the SRAM cell structure. It is known that the cell ratio r and $V_{TH}$ influence the SNM in Equation 1. A designed value sets a parameter, such as $V_{DD}$, and the exposure process must weigh values of the cell ratio r and transistor's $V_{TH}$ so as to improve the SNM. Since the SNM improvement in the exposure process weighs the $V_{TH}$ and r values, a reset of the exposure condition is necessary by weighing the size effect of the driver transistor. The cell ratio r is a ratio between the β value of the driver transistor Qn2 and the β value of the access transistor Qn4.

A description will be given of one illustrative exposure condition that weighs the gate size effect to improve the SNM. An adjustment of the exposure dose leads to an adjustment of the driver transistor's gate length. FIGS. 13B and 13C show part of the gate layer shown in FIG. 13A enclosed by a broken line. More specifically, FIG. 13B shows the LES with a large exposure dose in both the best focus state and the defocus state, whereas FIG. 13C shows the LES with a small exposure dose in both the best focus state and the defocus state.

The gate length can be shortened, as shown in FIGS. 13B and 13C, by increasing the exposure dose up to a permissible LES amount as an upper limit, making the driver transistor's $V_{TH}$ small, and improving the cell ratio and SNM. The reason why the cell ratio varies depending upon the exposure dose attributes to an exposure dose sensitivity difference between the access transistor and the driver transistor.

Still another embodiment resets the exposure condition for the SRAM cell so as to improve two electrical characteristics, such as SNM and a $V_{TH}$ difference. In that case, even when the exposure dose is made small and the cell ratio is made large in view of the LES amount as discussed above, the device may be still defective when the $V_{TH}$ difference is large. It is therefore necessary to set the exposure dose by weighing a difference amount of the size effect in the driver transistor.

When plural exposure parameters relate to the electrical characteristic, step 1008 selects the most influential exposure parameter on the predetermined electrical characteristic (or the exposure parameter that varies the predetermined electrical characteristic most significantly when changed) among the plural exposure parameter. For example, the exposure parameter is slightly varied and the electrical characteristic deterioration is verified through the MCSS of $V_{TH}$. Step 1002 stores, as the relationship, the influence of the exposure parameter on the electrical characteristic. The electrical characteristic is effectively corrected with the exposure parameters in order of influence.

Assume that the distortion is the most influential exposure parameter. The qualitative reason of the distortion's influence on $V_{TH}$ is that any overlay error between the source/drain layer and the gate layer cause a difference of ion dose in the active area and thus would scatter $V_{TH}$. FIG. 14B shows a pair of parts each enclosed by a broken line in FIG. 14A. In that case, the aberrational adjustment in the projection optical system reduces the overlay error and difference of $V_{TH}$ when giving the priority to distortion and permitting other aberrations. The NA adjustment of the projection optical system and the effective light source adjustment would indirectly change the distortion parameter.

The SRAM cell structure shown in FIG. 10 is less likely to be adopted in the 90 nm node or subsequent designs, because an overlay between the gate line and the active area greatly influences a circuit characteristic. However, it is noted that the above embodiment is applicable to such a fine node.

A diffraction optical element ("DOE") is effective to form a desired effective light source shape. Use of the DOE would contain an error caused by the manufacturing error of the DOE. In that case, another DOE would improve the electrical characteristic. The electrical characteristic improves when an optimal DOE is selected to a combination of the mask data and the exposure apparatus.

Figure 5:
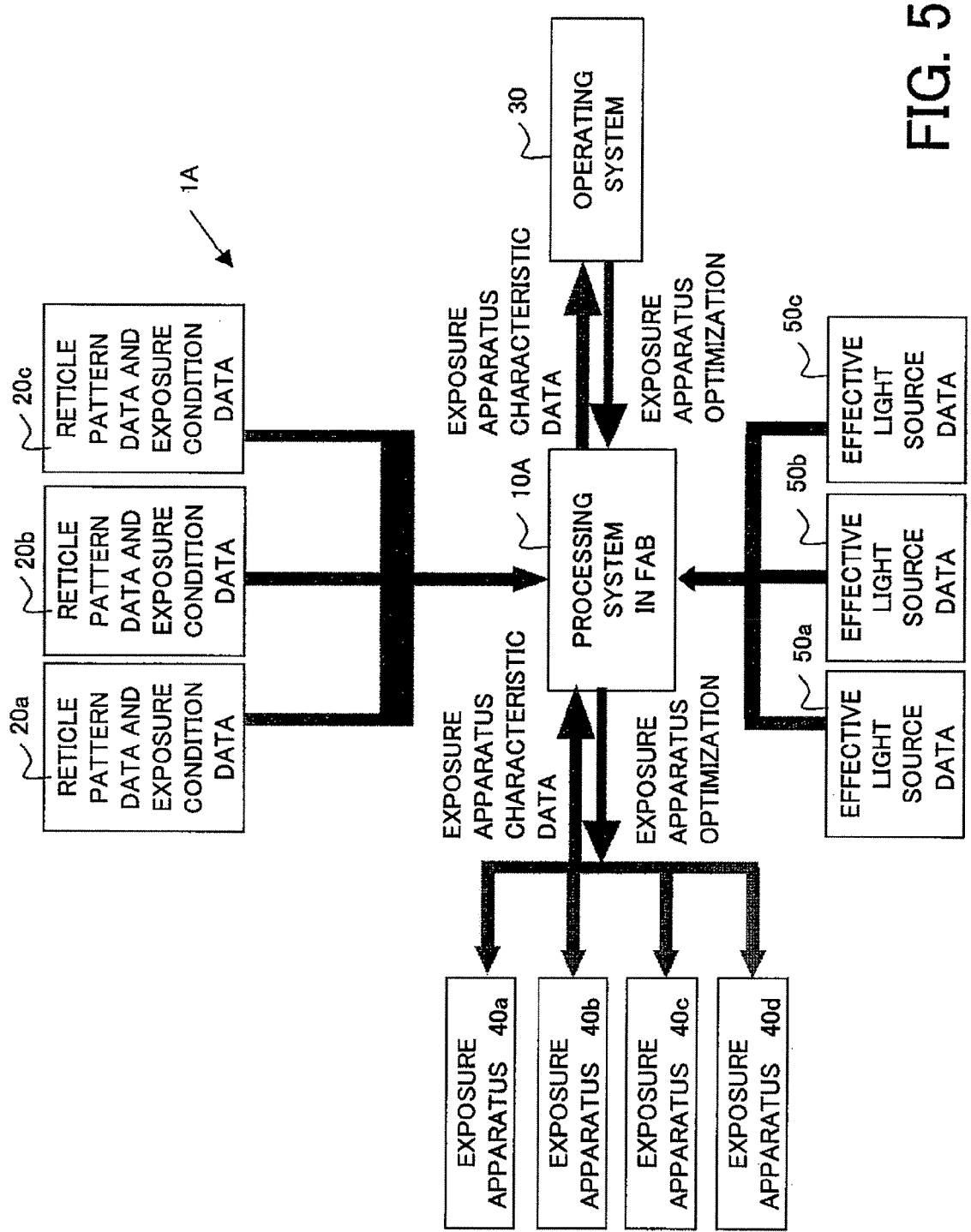
FIG. 5 is a schematic block diagram as a variation of the exposure system shown in FIG. 4.

In that case, as shown in FIG. 5, an exposure system 1A is used. The exposure system 1A is different from the exposure system 1 in that the exposure system 1A has input parts 50a to 50C. The input parts 50a to 50c enter the effective light source shape data into the processing system 10A. The DOE forms the effective light source shape.

When plural electrical characteristic exit, step 1006 selects the most influential electrical characteristic on the device yield rate in the plural electrical characteristics. In other words, each electrical characteristic is weighed based on a contribution degree to the final yield rate. For example, in determining the outer σ as the largest radius in the effective light source, the optimal outer σ to SNM improvement and the optimal outer σ to the $V_{TH}$ improvement exist. A relationship between the SRAM device structure in FIG. 6 and the electrical characteristic depends upon the transistor's $V_{TH}$ of Qn4, Qn2 and Op1 and the cell ratio r for SNM. The relationship between the SRAM device structure in FIG. 6 and the electrical characteristic depends upon the transistor's gate length, gate width, area, etc. for $V_{TH}$. Therefore, an optimal gate shape and exposure condition exit for each electrical characteristic. Accordingly, when there are plural electrical characteristics, they are weighed based on the influence on the final yield rate in determining the outer σ.

Assume that SNM is more influential on the device's yield rate than $V_{TH}$. In that case, step 1008 adjusts the exposure parameter such that SNM improves most.

An embodiment that weighs the electrical characteristics based on the contribution degree to the final yield rate can weigh the electrical characteristics based on the fraction defective of the electrical characteristics of the transistors Qn1 and Qn2 in the SRAM cell.

When the plural exposure parameters relate to the predetermined electrical characteristic, the most influential exposure parameter is selected among the plural exposure parameters. More specifically, step 1008 selects one of the plural exposure parameters, which one has the largest value when the set exposure parameter is substituted for a differential function of the function.

Assume that the electrical characteristic is SNM, and the NA, and annular ratio in the annular illumination (outer σ) and spherical aberration are involved in step 1002. In that case, the NA is varied, and a relationship between the NA and SNM, or a function SNM=f(NA) is simulated. Similarly, the annular ratio and the spherical aberration are varied, and a relationship between the annular ratio and SNM, i.e., SNM=f(outer σ), and a relationship between the spherical aberration and SNM, i.e., SNM=f(outer σ), are simulated.

Next, these three functions are differentiated by the NA, annular ratio, and the spherical aberration, into the three differential functions are obtained, such as d(SNM)/d(NA), d(SNM)/d(outer σ), and d(SNM)/d(spherical aberration). Next, values of the NA, outer σ, and the spherical aberration set in step 1004 are substituted in these differential functions and the largest differentiated values are obtained. If the differentiated values are arranged in order of NA>outer σ>spherical aberration, the NA is selected as an exposure parameter for optimization. Even when the NA is optimized, fed back step 1006 determines that SNM is still outside the predetermined range, the outer σ is optimized while the optimal value of the NA is maintained. Even when the outer σ is optimized, fed back step 1006 determines that SNM is still outside the predetermined range, the spherical aberration is optimized while the optimal value of the NA and outer σ are maintained. The exposure parameters can be effectively optimized by adjusting the parameters in order of higher influence on SNM.

Step 1008 may include the step of adjusting an exposure parameter that depends upon an optical system (e.g., an illumination optical system and a projection optical system by using an optical simulation, and the step of adjusting an exposure parameter that does not depend upon the optical system without an optical simulation. The optical simulation is one necessary type of simulation in simulating the device's electrical characteristic from the plate to be exposed.

In general, the optical simulation has a heavy calculational load. Therefore, the simulation that varies the NA, effective light source shape, and the aberrational parameter to verify the electrical characteristic needs a long calculation time period. On the other hand, relative to the optical image calculation, a parameter/exposure condition, such as scanning directions and rotations of wafer and reticle stages, is a parameter relating to slicing level setting, a focus position, and overlay, and involves after the optical image is determined. Once the optical image is calculated, and the optical image is processed and reused, a relationship between the electrical characteristic and a parameter, such as an exposure dose, an overlay, and a light source's wavelength, can be easily obtained.

The exposure apparatus parameter that does not depend upon the optical system includes an exposure apparatus parameter that can approximately calculate an optical image using an overlay of the optical image. For example, the parameters include a light source's spectrum distribution, a chromatic aberration, and a stage vibration (MSDz). When the light source has a spectrum distribution, the best focus position shifts among the respective wavelengths. An optical image can be formed by superposing defocus images of a reference wavelength, when the light source has a spectrum distribution. Since the optical image superposition has a small calculational load, the parameter adjustment in case of the spectrum distribution etc., may be adjusted after the optical simulation that determines the parameter that depends upon the optical system, such as an illumination shape and the aberration.

After the exposure parameter depending upon the optical system, such as an NA, an illumination shape, and an aberration, is optimized using a simulation that improves the SNM, the exposure parameter that does not depend upon the optical system, such as an exposure dose and a focus position, is optimized for effective parameter setting.

Turning back to FIG. 1, the procedure returns to step 1006 after step 1008. When step 1006 determines that the device has the predetermined electrical characteristic, the plate is exposed with the set exposure parameter (step 1010).

Further, the present invention is not limited to these preferred embodiments, and various variations and modifications may be made without departing from the scope of the present invention. For example, it is possible to set an exposure apparatus parameter based on a factor implicated with the electrical characteristic, such as LES, SWA, and LER.

What is claimed is:

1. A determination method of determining a value of an exposure parameter of an exposure apparatus for exposing a pattern of a reticle onto a plate using a light from a light source, said determination method comprising the steps of:
   setting the value of the exposure parameter;
   obtaining an electrical characteristic of a pattern formed on the plate by exposing the plate using the set values of the exposure parameter; and
   adjusting the set value of the exposure parameter so that the obtained electrical characteristic satisfies a predetermined electrical characteristic using information representing a relationship between the electrical characteristic of the pattern formed on the plate and the exposure parameter.

2. A determination method according to claim 1, wherein the exposure parameter includes a numerical aperture of a projection optical system for projecting the pattern of the reticle onto the plate, and an effective light source shape of the light for illuminating the reticle.

3. A determination method according to claim 1, wherein when a plurality of exposure parameters influence the predetermined electrical characteristic, the adjusted exposure parameter is the most influential exposure parameter on the predetermined electrical characteristic among the plurality of the exposure parameters.

4. A determination method according to claim 1, wherein the obtaining step obtains the most influential electrical characteristic on the device yield rate in a plurality of the electrical characteristics.

5. A determination method according to claim 1, wherein when a plurality of exposure parameters relates as a function to the predetermined electrical characteristic, the adjusted exposure parameter is one of the plurality of exposure parameters, which one has the largest value when the set value of the exposure parameter is substituted for a differential function of the function.

6. A determination method according to claim 1, wherein said adjusting step includes the steps of:

adjusting a first exposure parameter that depends upon the optical system, by using an optical simulation; and adjusting a second exposure parameter that does not depend upon the optical system, without an optical simulation.

7. A non-transitory computer-readable storage medium storing a program for enabling a computer to implement the determination method according to claim 1.

* * * * *